United States Patent
Mansour

(10) Patent No.: US 8,386,971 B2
(45) Date of Patent: Feb. 26, 2013

(54) METHOD AND APPARATUS FOR LOW DELAY RECURSIVE FILTER DESIGN

(75) Inventor: Mohamed Mansour, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 228 days.

(21) Appl. No.: 12/838,897

(22) Filed: Jul. 19, 2010

(65) Prior Publication Data

US 2011/0022999 A1 Jan. 27, 2011

Related U.S. Application Data

(60) Provisional application No. 61/228,066, filed on Jul. 23, 2009.

(51) Int. Cl.
*G06F 17/50* (2006.01)

(52) U.S. Cl. .......................... 716/100

(58) Field of Classification Search ............... 716/100
See application file for complete search history.

(56) References Cited

U.S. PATENT DOCUMENTS

| | | | | |
|---|---|---|---|---|
| 2006/0010186 A1* | 1/2006 | Best et al. | ...... | 708/300 |
| 2009/0017784 A1* | 1/2009 | Dickson et al. | ...... | 455/296 |
| 2010/0121897 A1* | 5/2010 | Bal et al. | ...... | 708/313 |

OTHER PUBLICATIONS

S. Boyd and L. Vanderbergeh, "Convex Optimization", Cambridge Univ. press, 2004.

A. Deczky, "General expression for the group delay of digital filters", Electron, Letters, vol. 5, pp. 663, Dec. 1969.

A. Deczky, "Recursive digital filters having equiripple group delay", IEEE Trans. on Circuits and systems, vol. 21, No. 1, pp. 131-134, Jan. 1974.

A. Fettweis, "A simple design of maximally flat delay digital filters", IEEE Trans. on Audio and Electroacoustics, vol. 20, No. 2, pp. 112-114, Jun. 1972.

J. Thiran, "Recursive digital filters with maximally Rat group delay", IEEE Trans. Circuit Theory, vol. CT-18, pp. 659-664, Nov. 1971.

A. Antoniou, "Digital Filters: Analysis, Design, and Applications", second edition, McGraw-Hill, 2000, pp. 138-160.

S. Powel and P. Chau, "A technique for realizing linear phase IIR filters", IEEE Trans. on Signal Processing, vol. 39, No. 11, pp. 2425-2435, Nov. 1991.

P. Regalia, S. Mitra, and P. Vaidyanathan, "The digital all-pass filter: a versatile signal processing building block", Proceeding of the IEEE, vol. 76, No. 1, pp. 19-37, Jan. 1988.

* cited by examiner

*Primary Examiner* — Jack Chiang
*Assistant Examiner* — Brandon Bowers
(74) *Attorney, Agent, or Firm* — Mima Abyad; Wade J. Brady, III; Frederick J. Telecky, Jr.

(57) ABSTRACT

A method and apparatus for low delay recursive filter design. The method includes determining a predefined filter template with higher magnitude specification than a target filter design, determining at least one relaxation bound on the filter specification utilizing the predefined filter template, specifying at least one constraint for the target filter design utilizing the at least one relaxation bound, and determining a low delay recursive filter design for minimizing the average group delay of the filter utilizing the at least one constraint.

1 Claim, 3 Drawing Sheets

MAGNITUDE RESPONSE

PASS BAND

TRANSITION BAND

PASS BAND GROUP DELAY

METHOD AND APPARATUS FOR LOW DELAY RECURSIVE FILTER DESIGN

CROSS-REFERENCE TO RELATED APPLICATIONS

This application claims benefit of U.S. provisional patent application Ser. No. 61/228,066, filed Jul. 23, 2009, which is herein incorporated by reference.

BACKGROUND OF THE INVENTION

1. Field of the Invention

Embodiments of the present invention generally relate to a method and apparatus for a low delay recursive filter design.

2. Description of the Related Art

In many real-time applications, the filter delay is a critical system performance issue. For example, in adaptive noise cancelation systems, fast tracking of the reference signal is crucial for noise cancelation. For these systems, the standard filter design techniques are generally not sufficient, and extra effort is needed to minimize the filter delay in the pass band. The standard filter design techniques, e.g., Butterworth and Chebechev filters, focus on the magnitude response, and the delay/phase issues are usually ignored.

SUMMARY OF THE INVENTION

Embodiments of the present invention relate to a method and apparatus for low delay recursive filter design. The method includes determining a predefined filter template with higher specification than a target filter design, determining at least one relaxation bound on the filter specification utilizing the predefined filter template, specifying at least one constraint for the target filter design utilizing the at least one relaxation bound, and determining a low delay recursive filter design for minimizing the average group delay of the filter utilizing the at least one constraint.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1A:
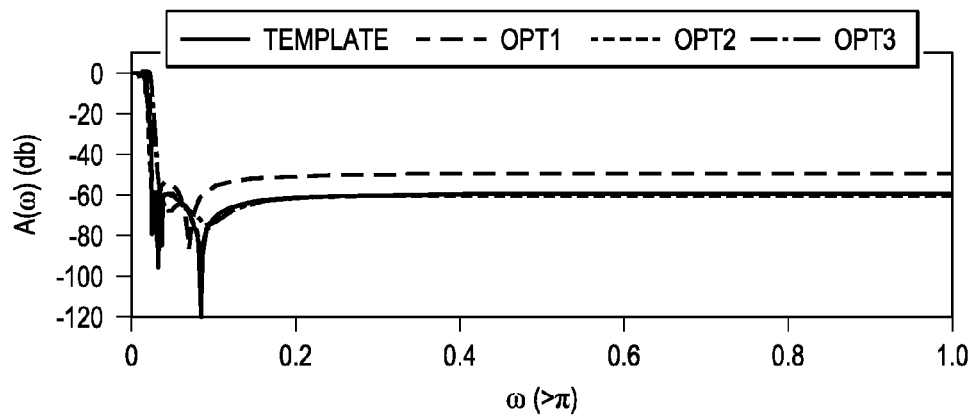
FIG. 1 is an embodiment of a delay minimization of a sixth order low pass elliptic filter using three design variation OPT1, OPT2 and OPT3.
Figure 1B:
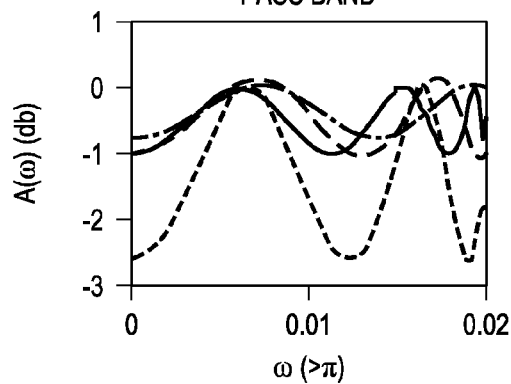
Figure 1C:
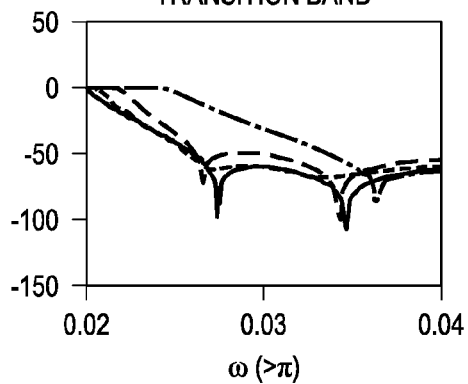
Figure 1D:
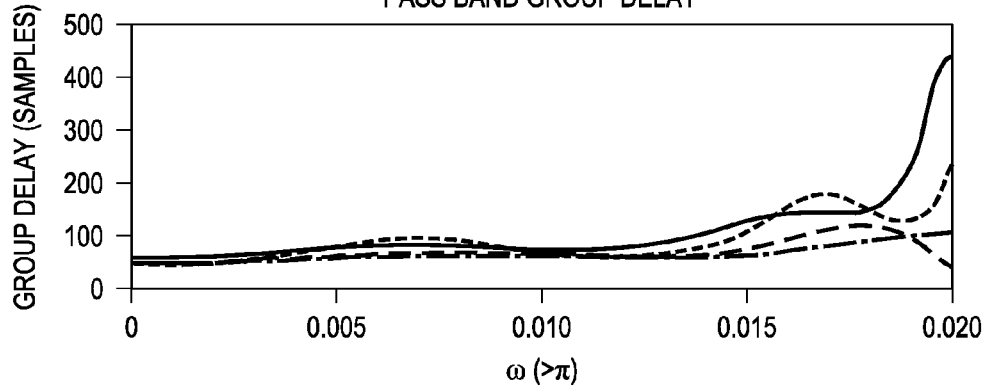

We propose a novel algorithm to design a low-delay IIR filter from a predesigned filter template. The filter template can have arbitrary magnitude and phase response and may be designed using standard filter design techniques. The problem is formulated as a nonlinear optimization problem of minimizing the average group delay over the pass band under constraints on stability and magnitude response.

We propose a novel algorithm to design a low-delay IIR filter from a predesigned filter template. The filter template can have arbitrary magnitude and phase response and may be designed using standard filter design techniques. The problem is formulated as a nonlinear optimization problem of minimizing the average group delay over the pass band under constraints on stability and magnitude response.

The proposed work focuses on minimizing the filter group delay in the pass band starting from a predesigned filter template, which may be designed using standard filter design techniques. We formulate a nonlinear optimization problem whose objective is to minimize the average group delay under constraints on magnitude response and filter stability. The problem is solved using standard techniques for constrained nonlinear optimization problems, e.g., log-barrier technique. Unlike earlier approaches, we do not specify the behavior of the group delay in the pass band. Rather, the objective is to minimize the average group delay. The proposed approach is shown to be effective in reducing the filter delay with reasonable magnitude distortion.

we will use the following notations:

$\rho_i$, and $\phi_i$: amplitude and frequency of the i-th zero $z_i$.

$r_i$ and $\theta_i$: amplitude and frequency of the i-th pole $p_i$.

$H(e^{j\omega})$: filter frequency response.

$A(\omega)$: amplitude response.

$\Phi(\omega)$: phase response $\tau(\omega)$: group delay $\Omega_p$, $\Omega_t$, and $\Omega_s$: passband, transition band, and stopband (respectively).

G: filter gain

In one embodiment of this invention, both poles and zeros occur in conjugate pairs. Without loss of generality, we assume that the filter order is even and the numerator order equals the denominator order. If the number of biquads is M, then we have:

$$H(z) = G \prod_{i=1}^{M} \frac{1 - 2\rho_i \cos\phi_i z^{-1} + \rho_i^2 z^{-2}}{1 - 2r_i \cos\theta_i z^{-1} + r_i^2 z^{-2}}$$

By straightforward substitution, we get $$A(\omega) = G^2 \prod_{i=1}^{M} \frac{\Gamma(\omega, \rho_i, \phi_i)}{\Gamma(\omega, r_i, \theta_i)}$$

where $$\Gamma(\omega, x, y) = (1 + x^2)^2 - 4x(1 + x^2)\cos\omega\cos y + 2x^2(\cos 2\omega + \cos 2y)$$

An explicit expression for $\tau(\omega)$ is $$\tau(\omega) = \sum_{i=1}^{M} \Lambda(\omega, r_i, \theta_i) - \Lambda(\omega, \rho_i, \phi_i)$$

where $$\Lambda(\omega, x, y) = \frac{1 - x\cos(\omega - y)}{1 + x^2 - 2x\cos(\omega - y)} + \frac{1 - x\cos(\omega + y)}{1 + x^2 - 2x\cos(\omega + y)}$$

We define the average group delay over the frequency band $\Omega$ as:

$$\bar{\tau}(\omega) = \frac{1}{|\Omega|} \int_\Omega \tau(\omega) d\omega$$

$$\text{where } |\Omega| = \int_{\omega \in \Omega} d\omega.$$

The low delay filter design problem aims at minimizing the average group delay in the pass band under constraints on the magnitude distortion in both the pass band and stop band compared to a predesigned filter amplitude response $A_T(\omega)$). Moreover, any feasible solution should be stable. The decision variables of the optimization problem are the poles and zeros of the transfer function in addition to the filter gain.

Define a set of decision variables, $$\underline{u} = r_1, \ldots, r_M, \theta_1, \ldots, \theta_M, \rho_1, \ldots, \rho_m, \phi_m, G)$$

The objective function of the filter design is to minimize the average group delay:

$$Q(\underline{u}) = \bar{\tau}(\Omega_p, \underline{u})$$

The constraints on the optimization problem are:

1) Stability Constraints:

$$r_i < 1 \text{ for } i = 1, 2, \ldots, M.$$

2) Gain Constraint:

$$G > 0$$

3) Magnitude Constraints:

$$\delta_{p2} \leq A(\omega, \underline{u}) \leq \delta_{p1} \text{ for } \omega \in \Omega_p$$

$$A(\omega, \underline{u}) \leq \delta_s \text{ for } \omega \in \Omega_s$$

$$A(\omega, \underline{u}) \leq \delta_{p2} \text{ for } \omega \in \Omega_t$$

The first constraint gives an equiripple pass band specification. The third constraint seems trivial, however, it is added to circumvent spurious peaks that are frequently encountered in the transition band of the final solution after numerical optimization. The thresholds in the above inequalities are derived from the initial filter template.

4) Positive Group Delay (Optional):

$$\tau(\omega) > 0 \omega \in \Omega_p$$

This constraint may be added to prevent possible negative group delay that may not be appropriate in some applications.

This problem is a constrained nonlinear optimization problem. To solve it, we need to digitize the frequency $\omega$ such that the magnitude constraints can be put in a standard form. In this case, the magnitude constraints can be written as:

$$g_i^{(p)}(\underline{u}) = \delta_{p1} - A(\omega_i, \underline{u}) \leq 0 \text{ for } 0 \text{ for } \omega_i \in \Omega_p$$

$$f_i^{(p)}(\underline{u}) = A(\omega_i, \underline{u}) - \delta_{p1} \leq 0 \text{ for } \omega_i \in \Omega_p$$

$$g_i^{(s)}(\underline{u}) = \delta_s A(\omega_i, \underline{u}) 0 \text{ for } \omega_i \in \Omega_s$$

$$g_i^{(t)}(\underline{u}) = \delta_{p2} - A(\omega_i, \underline{u}) 0 \text{ for } \omega_i \in \Omega_t$$

Now, the optimization problem is a standard constrained nonlinear optimization problem which can be solved using standard techniques. If we digitize the frequency to $N_p$, $N_s$, and $N_t$ points in the passband, stopband and transition band respectively, then the total number of constraints is $N_c = M + 1 + 2N_p + N_s + N_t$.

In some embodiments, many filter design algorithms result in a peak in the group delay near the passband edges. The effect of the group delay peak on the average group delay is more prominent for filters with narrow passband. Therefore, in our design example we use a narrowband lowpass elliptic filter. The filter specifications are as follow:

Passband gain=0 dB, stopband attenuation=60 dB
Passband ripple=1 dB $$\Omega_p = [0, 0.02\pi]$$

$$|\Omega_t| \leq 0.01\pi$$

This results in a sixth order filter. The average passband group delay of the template filter is 105 samples. The minimization of the group delay can be achieved by relaxing at least one of the three filter specifications: stopband attenuation, passband ripple, or transition bandwidth. In the following we consider three design procedures, each relaxing one of the filter specifications.

First we consider reducing the stopband attenuation to 50 dB (rather than 60 dB in the template filter). In this case we have $\delta_{p1}$ and $\delta_{p2}$ have the same values of the template filter, $\delta_s = 10^{-5}$. In the second design, we increase the passband ripple to 3 dB (rather than 1 dB in the template filter). In this case we have $\delta_{p1} = \delta_{p2}/2 \approx 1$, and $\delta_s = 10^{-6}$. In the third design, we increase the transition band by 50%. In this case we have $\delta_{p1}, \delta_{p2}$, and $\delta_s$ have the same values as the template filter. We only change the boundaries of $\Omega_t$ and $\Omega_s$. The outputs of the three optimization criteria are illustrated in FIG. 1.

Figure 2:
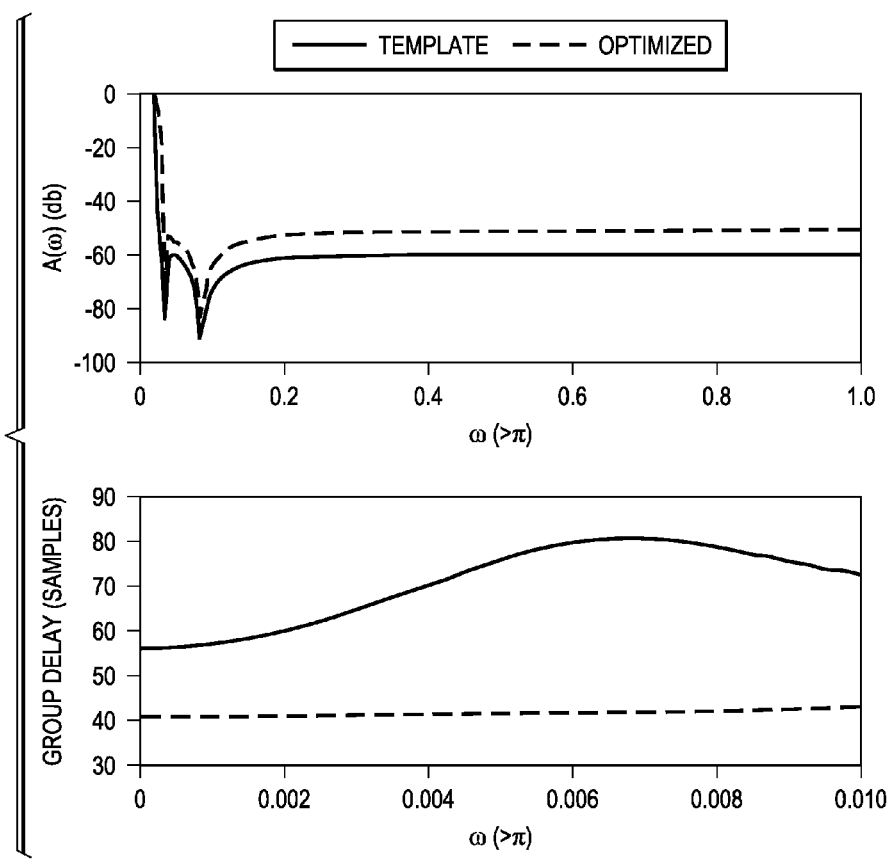
FIG. 2 is an exemplary embodiment of a group delay minimization.

Note that, most of the group delay minimization takes place at the passband edge where the group delay peaks in the template filter. Therefore the reduction of the peak group delay is reduced much more than the average group delay. Moreover, the variation in the group delay in the passband is much less and this results in reducing the phase distortion. If we combine the three above relaxations to optimize the filter design the optimized filter is as shown in FIG. 2.

It should be mentioned that, the frequency band upon which the average group delay is minimized is not necessarily the entire $\Omega_p$. In some practical applications, e.g., multi-stage decimation/interpolation filters, we are interested in only a subset of $\Omega_p$. This case can be handled straightforwardly in the proposed framework. In this case, the frequency band in the objective function and the constraints are modified to the frequency band of interest. In FIG. 2, we give an example using the previous template filter with the group delay minimized over the frequency band $[0, 0.01\pi]$, i.e., half the passband. We use the same optimization thresholds that are used in the last design example. Note that, the optimization is over the flat part of the group delay which gives relatively uniform minimization over the frequency band.

We presented a novel algorithm for minimizing the group delay in the pass band of a predesigned filter with constraints on the magnitude distortion. The problem is formulated as a constrained nonlinear optimization problem which is solved using standard techniques. The effectiveness of the proposed algorithm is verified using several design examples. We did not set any assumption of the predesigned template and the proposed algorithm works for all initial designs.

Although the optimization problem was formulated for group delay minimization, the proposed framework can be used for other phase optimization criteria. For example, linear phase optimization can be formulated within the same framework. Many variations of the optimization model could be added within the same framework. For example, the delay function could be optimized in a least-square fashion where we could make all the thresholds frequency-dependent to have arbitrary shaping of the magnitude spectrum without any increase the complexity of the optimization problem.

Figure 3:
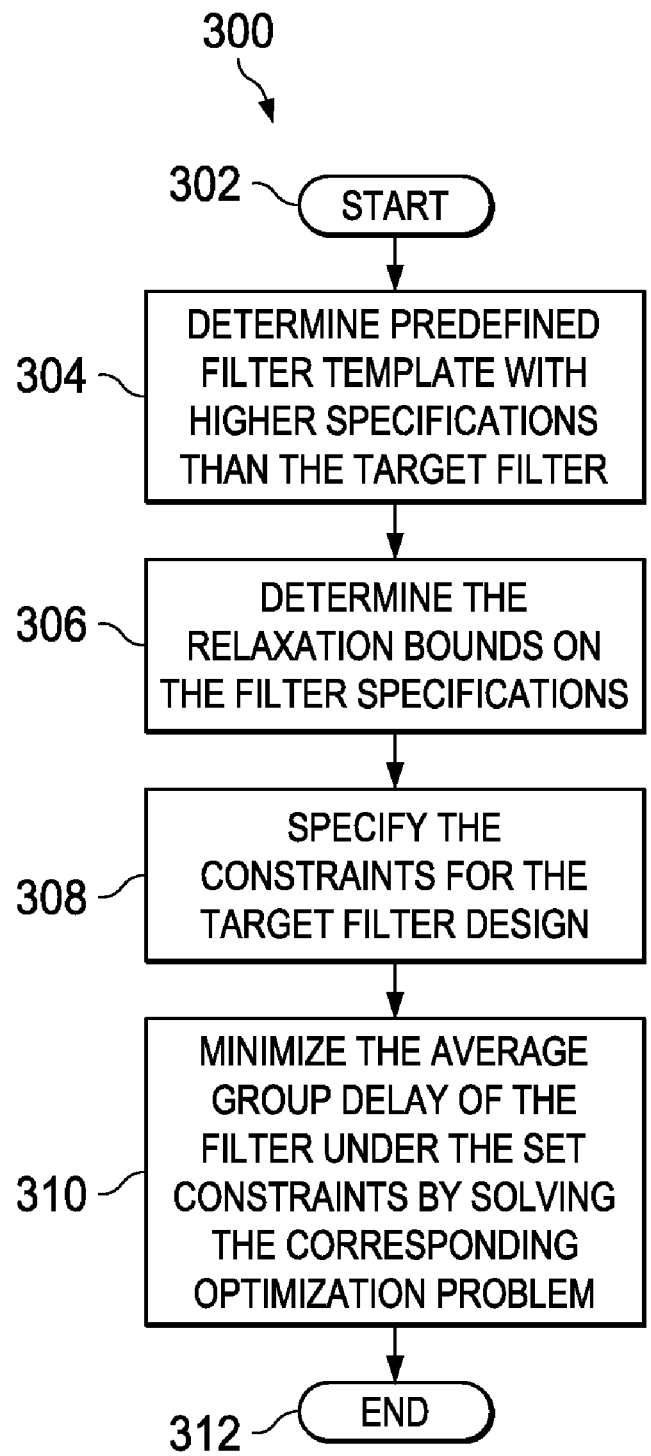
FIG. 3 is a flow diagram depicting an embodiment of a method for low delay recursive filter design.

FIG. 3 is a flow diagram depicting an embodiment of a method 300 for low delay recursive filter design. The method 300 starts at step 302 and proceeds to step 304. At step 304, the method 300 determines predefined filter template with higher specification than the target filter. At step 306, the method 300 determines the relaxation bounds on the filter specification. At step 308, the method 300 specifies the constraints for the target filter design. At step 310, the method 300 minimizes the average group delay of the filter under the set constraints by solving the corresponding optimization problem. The method 300 ends at step 312.

While the foregoing is directed to embodiments of the present invention, other and further embodiments of the invention may be devised without departing from the basic scope thereof, and the scope thereof is determined by the claims that follow.

What is claimed is:

1. A non-transitory computer-readable storage medium with an executable program stored thereon, wherein the program instructs a microprocessor to perform a method of a digital processor for low delay recursive filter design, the method comprising:
   determining a predefined filter template with higher magnitude specification than a target filter design;
   determining at least one relaxation bound on the filter specification utilizing the predefined filter template;
   specifying at least one constraint for the target filter design utilizing the at least one relaxation bound; and
   determining a low delay recursive filter design for minimizing the average group delay of the filter utilizing the at least one constraint.

* * * * *